US006724266B2

(12) United States Patent
Piazza et al.

(10) Patent No.: US 6,724,266 B2
(45) Date of Patent: Apr. 20, 2004

(54) DEVICE FOR PRODUCING A SIGNAL HAVING A SUBSTANTIALLY TEMPERATURE-INDEPENDENT FREQUENCY

(75) Inventors: Silvio Dalla Piazza, St-Imier (CH); Pierre-André Farine, Neuchâtel (CH); Roger Bühler, Le Locle (CH); Pascal Heck, Neuchâtel (CH)

(73) Assignee: Eta SA Fabriques d'Ebauches, Grenchen (CH)

( * ) Notice: Subject to any disclaimer, the term of this patent is extended or adjusted under 35 U.S.C. 154(b) by 0 days.

(21) Appl. No.: 10/169,160

(22) PCT Filed: Dec. 7, 2000

(86) PCT No.: PCT/EP00/12434

§ 371 (c)(1),
(2), (4) Date: Sep. 24, 2002

(87) PCT Pub. No.: WO01/52001

PCT Pub. Date: Jul. 19, 2001

(65) Prior Publication Data

US 2003/0052743 A1 Mar. 20, 2003

(30) Foreign Application Priority Data

Jan. 10, 2000 (EP) ............................................ 00100427

(51) Int. Cl.[7] .................................................. H03B 5/04
(52) U.S. Cl. .......................... 331/46; 331/176; 331/158
(58) Field of Search .......................... 331/46, 176, 158, 331/41

(56) References Cited

U.S. PATENT DOCUMENTS

| | | | | | |
|---|---|---|---|---|---|
| 4,071,797 | A | * | 1/1978 | Zumsteg et al. | 310/361 |
| 4,159,622 | A | * | 7/1979 | Akahane | 368/85 |
| 4,344,046 | A | * | 8/1982 | Zumsteg | 331/158 |
| 4,345,221 | A | | 8/1982 | Zumsteg | |
| 4,427,952 | A | * | 1/1984 | Zumsteg | 331/176 |

FOREIGN PATENT DOCUMENTS

| | | | |
|---|---|---|---|
| CH | 15 278 / 65 | A4 | 11/1967 |
| DE | 23 60 656 | A1 | 7/1975 |
| FR | 982 491 | | 6/1951 |
| GB | 2 006 520 | A | 5/1979 |

* cited by examiner

*Primary Examiner*—Robert Pascal
*Assistant Examiner*—Joseph Chang
(74) *Attorney, Agent, or Firm*—Sughrue Mion, PLLC

(57) ABSTRACT

The device (1) includes a mixer (4) which generates a signal (S4) having a frequency (F4) equal to the difference between two frequencies (F2, F3), which are those of two signals (S2, S3) each generated by a generator (2, 3) and which vary parabolically as a function of the temperature (T) with quadratic coefficients ($\beta_1$,$\beta_2$) that are different to each other.

Figure 1:
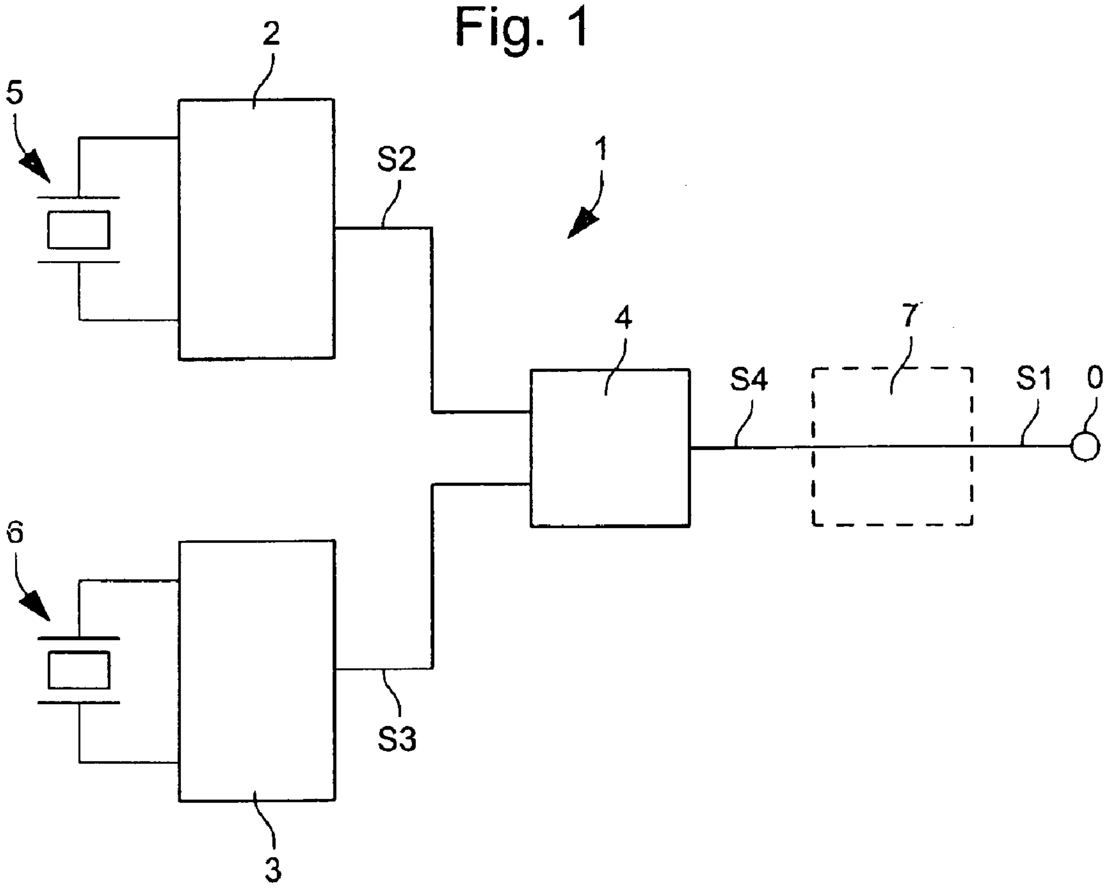

In order for the frequency (F4) of the signal (S4) generated by the mixer (4) to be at least substantially independent of the temperature (T), the generators (2, 3) are arranged such that the ratio of the quadratic coefficients ($\beta_1$,$\beta_2$) is equal to the inverse of the ratio of values ($F2_r$, $F3_r$) that the corresponding frequencies (F2, F3) have at a determined temperature ($T_r$).

3 Claims, 1 Drawing Sheet

DEVICE FOR PRODUCING A SIGNAL HAVING A SUBSTANTIALLY TEMPERATURE-INDEPENDENT FREQUENCY

The present invention concerns a device for generating a first signal having a first frequency, including:

- first generator means for generating a second signal having a second frequency that varies at least substantially parabolically as a function of the temperature with a first quadratic coefficient, which has a first maximum value at a first inversion temperature, and which has a first determined value at a reference temperature;
- second generator means for generating a third signal having a third frequency which also varies at least substantially parabolically as a function of the temperature with a second quadratic coefficient, different from said first parabolic coefficient, which has a second maximum value at a second inversion temperature, and which has a second determined value at said reference temperature; and
- mixing means for generating a fourth signal having a fourth frequency equal to the difference between said second and said third frequency.

Such a device is disclosed, for example, in Swiss Patent Nos. CH 626 500 and CH 631 315.

The two devices disclosed in these documents include a generator circuit which responds to the signal provided by the mixing circuit to generate correction pulses whose frequency depends upon that of the mixing signal, and thus upon the temperature. The output signal of these two devices is obtained by adding these correction pulses to the signal provided, after dividing its frequency, by one of the two oscillator circuits.

As a result of this arrangement, the frequency of the output signal provided by these devices is substantially independent of the temperature when it is measured over quite a long period. But also as a result of this arrangement, the frequency of the output signal exhibits abrupt variations at each appearance of a correction pulse. In other words, the frequency spectrum of this output signal has a very large number of lines of significant width, the position of these lines also varying with the temperature.

The devices disclosed in the aforementioned documents cannot therefore be used if it is necessary to have a signal with not only a temperature independent frequency but also a frequency spectrum having only a limited number of lines with fixed positions, which are also temperature independent. A signal having these properties is, for example, necessary when a high frequency signal picked up by an antenna, has to be synchronised, in a telecommunication device, with a low frequency signal generated in the device.

It is well known that oscillators including a so-called AT cut quartz resonator generate signals whose frequency is very stable as a function of the temperature. But, by nature, this frequency is quite high. If one wishes to make a device supplying a signal having a relatively low frequency from such an oscillator, it is thus necessary to associate a frequency divider circuit with the latter, which complicates the device and makes it more expensive. Moreover, the electric power consumed by such a frequency divider circuit is quite high because of the high frequency of the signal that it receives, which can be a serious drawback when the electric power has to be provided by a power source of small dimensions such as the battery of an electronic wristwatch.

One object of the present invention is thus to propose a device of the same type as those which are disclosed in the aforementioned patents but which does not have their drawbacks, which were also mentioned hereinbefore, i.e. a device generating an output signal having an at least substantially temperature independent frequency but also having a reduced number of lines, the position of these lines being also substantially temperature independent.

Another object of the present invention is to propose a device supplying a signal having a frequency, which has a variation as a function of the temperature, as low as that of the frequency of the signal provided by an oscillator including an AT cut quartz resonator, but which can be much lower than the latter.

The device according to the present invention whose features are listed in the annexed claim 1 achieves these objects.

As will be made clear hereinafter, as a result of these features the frequency of the signal supplied by a device according to the present invention is at least substantially temperature independent and does not exhibit any abrupt jump when the temperature varies. The frequency spectrum of this signal thus only has a small number of lines, and the position of these lines is also substantially temperature independent.

Moreover, as a result of these features the frequency of the signal provided by a device according to the present invention can be much lower than that of the signal provided by an oscillator including an AT cut quartz resonator. It is thus possible, in numerous cases, to use the signal provided by a device according to the present invention directly, without having to lower its frequency using a frequency divider circuit, which reduces the cost price and electric power consumption of the device. Furthermore, if a frequency divider circuit is, despite everything, associated with a device according to the present invention, its electric power consumption will be lower since the frequency of the signal provided by the device is low.

Other objects and advantages of the present invention will become clear from the following description, which will be made using the annexed drawing, in which:

FIG. 1, which is the only FIGURE, is a diagram of an embodiment of the device according to the present invention and of a variant thereof.

In the embodiment shown schematically and by way of non-limiting example in FIG. 1, the device according to the present invention, which is designated as a whole by the reference 1, is intended to provide, at an output terminal designated by the reference O, a periodic signal S1 having a frequency F1 which, as will be shown hereinafter, is at least substantially temperature independent.

Device 1 thus includes a first and a second generator circuits, respectively designated by the references 2 and 3, and a mixer circuit, designated by the reference 4.

After having read the following description, those skilled in the art will have no difficulty in making generators 2 and 3 in one or other of the various manners known to them. These generators 2 and 3 will not, therefore, be described in detail here.

It will simply be mentioned that generators 2 and 3 are arranged so as to provide at their output a signal S2 having a frequency F2 and, respectively, a signal S3 having a frequency F3.

Generators 2 and 3 thus each include an oscillator circuit formed, in a conventional manner, by an amplifier, not shown separately, coupled to a piezoelectric resonator whose features will be specified hereinafter.

Depending on the particular case, signals S2 and/or S3 can be provided directly by the oscillator forming part of the respective generator 2 or 3, or be provided by frequency divider circuits receiving the signal produced by the respective oscillator and providing these signals S2 or S3.

The resonator which forms part of generator 2 and whose features thus determine the frequency F2 of signal S2 has been shown with the reference 5 and the resonator which forms part of generator 3 and whose features thus determine frequency F3 of signal S3 has been shown with the reference 6.

In the present invention, resonator 5 and resonator 6 both have the form of a quartz tuning fork, but resonator 5 is arranged so that its branches vibrate in a flexural mode, whereas resonator 6 is arranged so that its branches vibrate in a torsional mode.

Moreover, in the present example, resonators 5 and 6 are arranged so that frequency F2 of signal S2 is lower than frequency F3 of signal S3, and so that these frequencies F2 and F3 are in a determined ratio whose value will be specified hereinafter, in addition to other features of these resonators 5 and 6.

Mixer circuit 4, which also includes device 1, is also a circuit which those skilled in the art will have no difficulty in making in one or other of the various manners well known to them. This mixer circuit 4 will not, therefore, be described in detail here.

It will simply be mentioned that mixer circuit 4 includes two inputs one of which is connected to the output of generator 2 and thus receives signal S2 and the other is connected to the output of generator 3 and thus receives signal S3.

It will also be mentioned that mixer circuit 4 is arranged so that frequency F4 of signal S4 that it provides at its output is equal to the difference between frequencies F3 and F2 of signals S3 and, respectively, S2.

In the embodiment shown in full lines in FIG. 1, the output of mixer circuit 4 is directly connected to output 0 of device 1, so that signal S1 is formed by signal S4 and, of course, frequency F1 is identical to frequency F4. This frequency F1 of signal S1 is thus, in this case, equal to the difference between frequencies F3 and F2.

Those skilled in the art will understand that if necessary, mixing circuit 4 can comprise a filter intended to avoid the appearance, in signal S1, of parasitic components having frequencies different from frequency F1.

Those skilled in the art know that the consequence of the aforementioned constitution of resonators 5 and 6 is that the variation in frequencies F2 and F3 as a function of temperature, which will be designated T, is given by two equations, well known to those skilled in the art, having similar forms.

Thus the variation of frequency F2 as a function of temperature T is given by the following equation:

$$F2(T)=F2_r(1+\alpha_1(T-T_r)+\beta_1(T-T_r)^2+\gamma_1(T-T_r)^3) \quad (1)$$

Wherein:

- $T_r$ is a reference temperature which is often selected to be equal to 25° C.;
- $F2_r$ is the frequency of signal S2 at temperature $T_r$; and
- $\alpha_1$, $\beta_1$, $\gamma_1$ are coefficients which depend, particularly, on the geometrical, mechanical and electrical features of resonator 5 and the value selected for reference temperature $T_r$.

Likewise, the variation of frequency F3 as a function of temperature T is given by the following equation:

$$F3(T)=F3_r(1+\alpha_2(T-T_r)+\beta_2(T-T_r)^2+\gamma_2(T-T_r)) \quad (2)$$

where:

- $T_r$ is the same reference temperature as in equation (1);
- $F3_r$ is the frequency of signal S3 at temperature $T_r$; and
- $\alpha_2$, $\beta_2$, $\gamma_2$ are coefficients which depend, particularly, on the geometrical, mechanical and electrical features of resonator 6 and the value selected for reference temperature $T_r$.

The two coefficients $\alpha_1$ and $\alpha_2$, the two coefficients $\beta_1$ and $\beta_2$, and the two coefficients $\gamma_1$ and $\gamma_2$ are generally called, respectively, linear, quadratic and cubic coefficients.

In order to simplify the following considerations, it will be assumed first of all that cubic coefficients $\gamma_1$ and $\gamma_2$ have very low values, which is in fact the case, so that the terms $\gamma_1(T-T_r)^3$ and $\gamma_2(T-T_r)^3$ which appear in equation (1) and, respectively, in equation (2) hereinbefore, can be ignored.

In these conditions, equations (1) and (2) respectively become:

$$F2(T)=F2_r(1+\alpha_1(T-T_r)+\beta_1(T-T_r)^2) \quad (3)$$

and $$F3(T)=F3_r(1+\alpha_2(T-T_r)+\beta_2(T-T_r)^2) \quad (4)$$

These equations (3) and (4) show that, still in the above conditions, frequencies F2 and F3 vary parabolically as a function of temperature T. Further, these equations (3) and (4) show that frequencies F2 and F3 have maximum values $F2_0$ and, respectively, $F3_0$ when temperature T has values $T0_1$ and, respectively, $T0_2$ given by the following equations.

$$T_{01}=T_r-\alpha_1/2\beta_1 \quad (5)$$

and $$T_{02}=T_r-\alpha_2/2\beta_2 \quad (6)$$

These temperatures $T_{01}$ and $T_{02}$ are those which are generally called inversion temperatures of resonators 5 and, respectively, 6.

For a reason which will be made clear hereinafter, the features of resonators 5 and 6 are determined so that, on the one hand, frequency F2(T) is always lower than frequency F3(T) and, on the other hand, the quadratic coefficient $\beta_1$ is higher than quadratic coefficient $\beta_2$. Those skilled in the art will see that these conditions, as well as other conditions which will be defined hereinafter, can easily be fulfilled because resonator 5 vibrates in a flexural mode and resonator 6 vibrates in a torsional mode.

It will also be assumed, for a reason that will be made clear hereinafter, that the features of resonators 5 and 6 are determined so that inversion temperatures $T_{01}$ and $T_{02}$ are equal. Equations (5) and (6) show that, in these conditions, in particular:

$$\alpha_2=\alpha_1\beta_2/\beta_1 \quad (7)$$

It will further be assumed, again for a reason which will be made clear hereinafter, that the features of resonators 5 and 6 are also determined so that the ratio of quadratic coefficients $\beta_1$ and $\beta_2$ is equal to the inverse of the ratio of values $F2_r$ and $F3_r$ that frequencies F2(T) and F3(T) have at reference temperature $T_r$ or, in other words:

$$\beta_1/\beta_2=F3_r/F2_r$$

or even:

$$F2_r=F3_r\beta_2/\beta_1 \quad (8)$$

As was seen hereinbefore, frequency F1 of signal S1 provided by mixer circuit 4 is equal to the difference between frequencies F3 and F2 of signals S3 and, respectively, S2. According to equations (3) and (4) thus:

$$F1(T)=(F3_r-F2_r)+(F3_r\alpha_2-F2_r\alpha_1(T-T_r)+(F3_r\beta_2-F2_r\beta_1)(T-T_r)^2 \quad (9)$$

By replacing $\alpha_2$ and $F2_r$ in the second and third terms of equation (9), by their respective values given by equations (7) and (8), one obtains:

$$F1(T)=(F3_r-F2_r)+(F3_r\alpha_1\beta_2/\beta_1-F3_r\alpha_1\beta_2/\beta_1)(T-T_r)+(F3_r\beta_2-F3_r\beta_1\beta_2/\beta_1)(T-T_r)^2$$

It can thus be seen that, in the conditions defined hereinbefore, the factors which multiply respectively the terms $(T-T_r)$ and $(T-T_r)^2$ of equation (9) are zero. It follows that this equation (9) can be reduced to:

$$F1(T)=F3_r-F2_r \quad (10)$$

Since frequencies $F2_r$ and $F3_r$ are independent of temperature T, so is frequency F1 of signal S1.

The considerations that have just been made are evidently also valid if account is taken, despite their low value, of terms $\gamma_1(T-T_r)^3$ and $\gamma_2(T-T_r)^3$ which respectively form part of equations (1) and (2) above. Those skilled in the art will easily see that, in such a case, the variation in frequency F1 of signal S1 as a function of temperature T is given by the following equation:

$$F1(T)=(F3_r-F2_r)+(F3_r\gamma_2-F2_r\gamma_1)(T-T_r)^3 \quad (11)$$

This equation (11) is that of a cubic curve having an inflexion point located at temperature $T_r$.

Those skilled in the art will easily see that the last term of equation (11) has extremely low values, so that frequency F1 of signal S1 is, despite the influence of this term, practically independent of temperature T.

It is, however, clear that equation (11) only represents the variation in frequency F1 of signal S1 as a function of temperature T when the aforementioned conditions are strictly fulfilled, i.e. when the inversion temperatures $T_{01}$ and $T_{02}$ are equal, and the ratio of quadratic coefficients $\beta_1$ and $\beta_2$ is equal to the inverse of the ratio of frequencies $F2_r$ and $F3_r$.

Those skilled in the art know very well that these conditions cannot generally be fulfilled when resonators 5 and 6 are manufactured on a large scale. In order to fulfil these conditions, it is of course possible to take special measures during the manufacture of such resonators such as sorting them as a function of their features and matching them. However, such measures evidently increase the cost price of these resonators, and thus that of the device utilising them.

The Applicant has however analytically determined and verified by test that even if a device such as device 1 is manufactured using non matched resonators, as they leave their respectively manufacturing lines, the variation in frequency F1 of signal S1 produced by this device as a function of temperature T is always considerably lower than that of the signal supplied by a conventional oscillator including a resonator vibrating in a flexural or torsional mode.

Thus, for example, the Applicant has made devices according to the present invention by using resonators such that the inversion temperatures of signals S2 and S3 differed by 10° C. and the ratio of coefficients P1 and P2 were only equal to within +/−10% of the inverse ratio of frequencies $F2_r$ and $F3_r$.

The Applicant has observed that, even in these extreme conditions, the variation of frequency F1 within a range of temperatures from −40° C. to +85° C., is always less than +/−10 ppm.

By way of comparison, it is known that the frequency of a signal provided by a conventional oscillator varies, within the same temperature range, between approximately 0 and −160 ppm when the resonator vibrates in a flexural mode, and between approximately 0 and −56 ppm when the resonator vibrates in a torsional mode.

It should be noted that, in any case, frequency F1 of signal S1 follows a substantially cubic curve when temperature T varies.

As a result, the differences in frequency F1 of signal S1 have opposite signs depending on whether temperature T is higher or lower than reference temperature $T_r$, which automatically ensures almost perfect compensation for these differences when temperature T varies on either side of reference temperature $T_r$.

Those skilled in the art will see that this variation in frequency F1 as a function of temperature T is similar to that of the frequency of the signal provided by an oscillator including an AT cut resonator. However, those skilled in the art also know that the latter frequency is, by nature, quite high, and that it is very often necessary to associate a frequency divider circuit with such an oscillator, with the various drawbacks, mentioned hereinbefore, which are linked to the presence of such a circuit.

However, it can easily be seen that the frequency of the signal provided by a device according to the present invention may be relatively low since it is equal to the difference in the frequencies of the two other signals, signals S2 and S3 in the example described hereinbefore. It is thus often unnecessary to associate a frequency divider circuit with this device, which removes the drawbacks linked to the presence of such a circuit. Even if a frequency divider circuit has, for any reason, to be associated with a device according to the present invention, its electric power consumption is much lower than in the case of an oscillator including an AT cut resonator since the frequency of the signal, which it receives, is much lower than in the latter case.

It can thus be seen that the device according to the present invention has substantially the same frequency stability advantage for the signal that it provides as a function of temperature as an oscillator including an AT cut resonator, without having the drawbacks of the latter.

It can also be seen that when the temperature varies, the frequency of the signal provided by a device according to the present invention varies continuously, without any abrupt jump, unlike the frequency of signals generated by the devices disclosed in the aforementioned Swiss Patent Nos. CH 626 500 and CH 631 315. Consequently, the frequency spectrum of the signal provided by a device according to the present invention only has a small number of lines and the position of these lines is substantially temperature independent.

In particular, it will be noted that one will preferably choose quadratic coefficients $\beta_1$, and $\beta_2$ and frequency values $F2_r$ and $F3_r$ in an integer ratio allowing the interfering components of the output signal to be eliminated and great spectral purity to be obtained. This result is for example advantageously obtained by using a quartz tuning fork vibrating in a flexural mode to generate signal S2 and whose quadratic coefficient $\beta_1$ has a value, from experience, of substantially −0.038 ppm/° C., and by using a quartz tuning fork vibrating in a torsional mode to generate signal S3 and whose quadratic coefficient $\beta_2$ has a value, from experience, of substantially −0.0126 ppm/° C. In such case, the ratio $\beta_1/\beta_2$ has a value of substantially 3.

In order to satisfy the equation (8) hereinbefore, frequency values $F2_r$ and $F3_r$ are chosen to be in an equivalent ratio, namely, for example, respectively equal to 131.072 kHz and 393.216 kHz. It will be noted that the frequency of signal S4 thereby obtained at the output of mixer circuit 4 of FIG. 1 is in such case substantially equal to 262.144 kHz, i.e. advantageously eight times the frequency 32.768 kHz which is typically desired in horological applications. A divider-by-eight circuit can thus advantageously be connected to the output of mixer circuit 4 in order to derive a signal at the frequency of 32.768 kHz. Such a divider circuit is for example shown in dotted lines in FIG. 1, in which it is designated by the reference 7.

It should also be noted that the device according to the present invention, unlike the devices disclosed in the aforementioned Swiss Patent Nos. CH 626 500 and CH 631 315, can not only be arranged so that the signal that it generates is formed of pulses, but also so that its signal is sinusoidal.

Numerous modifications can evidently be made to the device according to the present invention without thereby departing from the scope of the latter.

Thus, resonators such as resonators 5 and/or 6 of the device of FIG. 1 can take a different shape to the tuning fork shape which they have in this device, for example the shape of bars, or they can be made in a different piezoelectric material to quartz. These resonators can also be arranged so as to vibrate in another mode, for example an extensional mode. It is however, evident that whatever their shape, their material, and/or their mode of vibration, these resonators must be such that the frequency variation as a function of temperature of the signals generated by the generators of which they form part, must be at least substantially parabolic.

Likewise, and again by way of example, a device according to the present invention may include, as has already been mentioned, a frequency divider circuit 7 arranged between the output of the mixer circuit, circuit 4 in the example described hereinbefore, and the output of the device, output O in the same example.

In this variant of the device according to the present invention, signals S1 and S4 are obviously no longer the same. Moreover, the various components of the device, in particular the circuits generating signals S2 and S3, must be arranged so that frequency F4 of signal S4 is equal to the product of frequency F1 of signal S1 by the division factor of frequency divider 7, which is of course an integer number greater than 1. This result is for example obtained in accordance with the aforementioned numerical example, wherein the frequency values $F2_r$ and $F3_r$ are chosen to be equal to 131.072 kHz and 393.216 kHz respectively.

It will be recalled that, in the first embodiment of the device according to the present invention, which was described hereinbefore, signal S4 directly constitutes signal S1. In such case, frequency F4 of signal S4 is thus equal to the product of frequency F1 by the number 1.

Generally, one can thus say that the various components of a device according to the present invention must be arranged such that the frequency of signal S4 generated by the mixer circuit is equal to the product of the frequency of output signal S1 of the device by an integer number equal to or greater than 1.

It should also be noted that the presence of a frequency divider such as divider 7 of FIG. 1, between the output of the mixer circuit, circuit 4 of this same FIG. 1, and the output of a device according to the present invention, in no way modifies the frequency variation as a function of temperature of the signal provided by this latter output. A device according to the present invention thus still has the same advantages with respect to known devices, whether or not it includes a frequency divider between its mixer circuit and its output.

What is claimed is:

1. A device for generating a first signal having a first frequency, including:

first generator means for generating a second signal having a second frequency which varies at least substantially parabolically as a function of the temperature with a first quadratic coefficient, which has a first maximum value at a first inversion temperature, and which has a first determined value at a reference temperature;

second generator means for generating a third signal having a third frequency which also varies at least substantially parabolically as a function of the temperature with a second quadratic coefficient, different from said first quadratic coefficient, which has a second maximum value at a second inversion temperature, at least substantially equal to said first inversion temperature; and which has a second determined value at said reference temperature; and mixer means for generating a fourth signal having a fourth frequency equal to the difference between said third and said second frequency;

said first and said second generator means being arranged so that the ratio between said first and said second quadratic coefficient is at least substantially equal to the ratio between said second and said first determined value, and so that said fourth frequency is equal to the product of said first frequency by an integer number equal to or greater than 1, wherein the ratio between said second and said first determined value is substantially equal to an integer number.

2. A device according to claim 1, wherein the latter further includes a frequency divider circuit connected to the output of said mixer circuit and allowing said first signal to be derived from said fourth signal.

3. A device according to claim 1, wherein said first generator means include a first quartz resonator arranged to vibrate in a flexure mode, and wherein said second generator means include a second quartz resonator arranged to vibrate in a torsional mode.

* * * * *